(12) United States Patent
Chen et al.

(10) Patent No.: US 10,665,582 B2
(45) Date of Patent: May 26, 2020

(54) METHOD OF MANUFACTURING SEMICONDUCTOR PACKAGE STRUCTURE

(71) Applicant: Taiwan Semiconductor Manufacturing Co., Ltd., Hsinchu (TW)

(72) Inventors: Yi-Hsiu Chen, Hsinchu (TW); Chen-Hua Yu, Hsinchu (TW); Ming-Fa Chen, Taichung (TW); Wen-Chih Chiou, Miaoli County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/939,307

(22) Filed: Mar. 29, 2018

(65) Prior Publication Data

US 2019/0131289 A1 May 2, 2019

Related U.S. Application Data

(60) Provisional application No. 62/580,434, filed on Nov. 1, 2017.

(51) Int. Cl.
*H01L 21/00* (2006.01)
*H01L 25/00* (2006.01)
(Continued)

(52) U.S. Cl.
CPC ........ *H01L 25/50* (2013.01); *H01L 21/31058* (2013.01); *H01L 21/31144* (2013.01); *H01L 21/561* (2013.01); *H01L 21/565* (2013.01); *H01L 21/6835* (2013.01); *H01L 24/89* (2013.01); *H01L 24/94* (2013.01); *H01L 25/0655* (2013.01); *H01L 25/0657* (2013.01); *H01L 21/78* (2013.01); *H01L 22/32* (2013.01); (Continued)

(58) Field of Classification Search
CPC ..... H01L 25/50; H01L 24/89; H01L 25/0657; H01L 24/94; H01L 21/31144; H01L 21/561; H01L 21/31058; H01L 21/565; H01L 24/08; H01L 2224/08145; H01L 22/32; H01L 2224/73204; H01L 2224/80896; H01L 2224/80895; H01L 2224/80801; H01L 2224/32145; H01L 2224/16145; H01L 24/73; H01L 24/32; H01L 24/16; H01L 21/78; H01L 2225/06513; H01L 2225/06596
USPC ......................................................... 438/107
See application file for complete search history.

(56) References Cited

U.S. PATENT DOCUMENTS 6,759,345 B2 * 7/2004 Kawano ............ H01L 21/31053
257/E21.244
6,790,742 B2 * 9/2004 Yang ................. H01L 21/76229
257/E21.548
(Continued)

*Primary Examiner* — Vu A Vu
(74) *Attorney, Agent, or Firm* — JCIPRNET

(57) ABSTRACT

A method of manufacturing a semiconductor package structure includes the following steps. A die is bonded to a wafer. A dielectric material layer is formed on the wafer and the die. The dielectric material layer covers a top surface and sidewalls of the die. At least one planarization process is performed to remove a portion of the dielectric material layer and a portion of the die, such that the top surface of the die is exposed and a dielectric layer aside the die is formed. The dielectric layer surrounds and covers the sidewalls of the die.

20 Claims, 9 Drawing Sheets

(51) Int. Cl.
*H01L 21/56* (2006.01)
*H01L 21/3105* (2006.01)
*H01L 21/311* (2006.01)
*H01L 23/00* (2006.01)
*H01L 25/065* (2006.01)
*H01L 21/683* (2006.01)
*H01L 21/66* (2006.01)
*H01L 21/78* (2006.01)

(52) U.S. Cl.
CPC ............ *H01L 24/08* (2013.01); *H01L 24/13* (2013.01); *H01L 24/16* (2013.01); *H01L 24/32* (2013.01); *H01L 24/73* (2013.01); *H01L 2221/6834* (2013.01); *H01L 2221/68327* (2013.01); *H01L 2224/08145* (2013.01); *H01L 2224/13101* (2013.01); *H01L 2224/13139* (2013.01); *H01L 2224/13144* (2013.01); *H01L 2224/13147* (2013.01); *H01L 2224/16145* (2013.01); *H01L 2224/32145* (2013.01); *H01L 2224/73204* (2013.01); *H01L 2224/80801* (2013.01); *H01L 2224/80895* (2013.01); *H01L 2224/80896* (2013.01); *H01L 2225/06513* (2013.01); *H01L 2225/06596* (2013.01); *H01L 2924/1203* (2013.01); *H01L 2924/1304* (2013.01); *H01L 2924/1433* (2013.01)

(56) References Cited

U.S. PATENT DOCUMENTS

| | | | |
|---|---|---|---|
| 8,395,269 B2 * | 3/2013 | Kawano | H01L 21/76898 257/685 |
| 8,476,774 B2 * | 7/2013 | Haba | H01L 21/6835 257/786 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,829,676 B2 * | 9/2014 | Yu | H01L 21/568 257/737 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,437,583 B1 * | 9/2016 | Shih | H01L 25/105 |
| 9,443,783 B2 | 9/2016 | Lin et al. | |
| 9,496,189 B2 | 11/2016 | Yu et al. | |
| 2014/0264930 A1 * | 9/2014 | Yu | H01L 24/19 257/774 |

* cited by examiner

METHOD OF MANUFACTURING SEMICONDUCTOR PACKAGE STRUCTURE

CROSS-REFERENCE TO RELATED APPLICATION

This application claims the priority benefit of U.S. provisional application Ser. No. 62/580,434, filed on Nov. 1, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

3DICs provide improved integration density and other advantages, such as faster speeds and higher bandwidth, because of the decreased length of interconnects between the stacked chips. However, there are quite a few challenges to be handled for the technology of 3DICs.

DETAILED DESCRIPTION

Figure 1A:
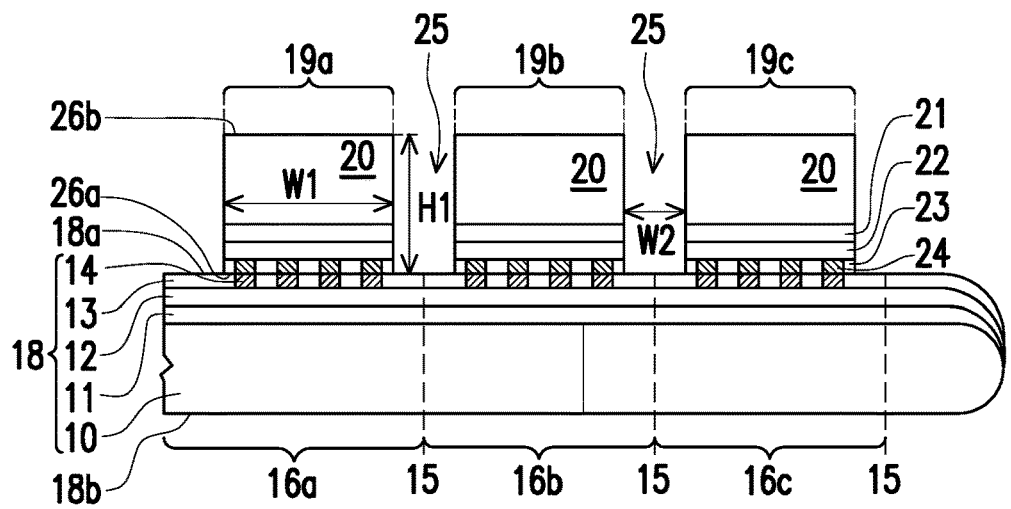
FIG. 1A to FIG. 1C are schematic cross-sectional views illustrating a method of forming a semiconductor package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
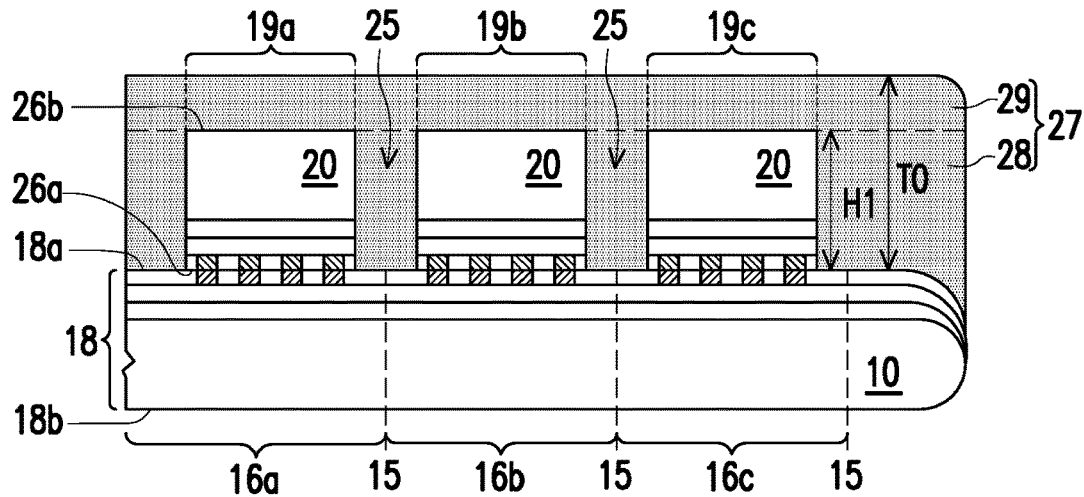
Figure 1C:
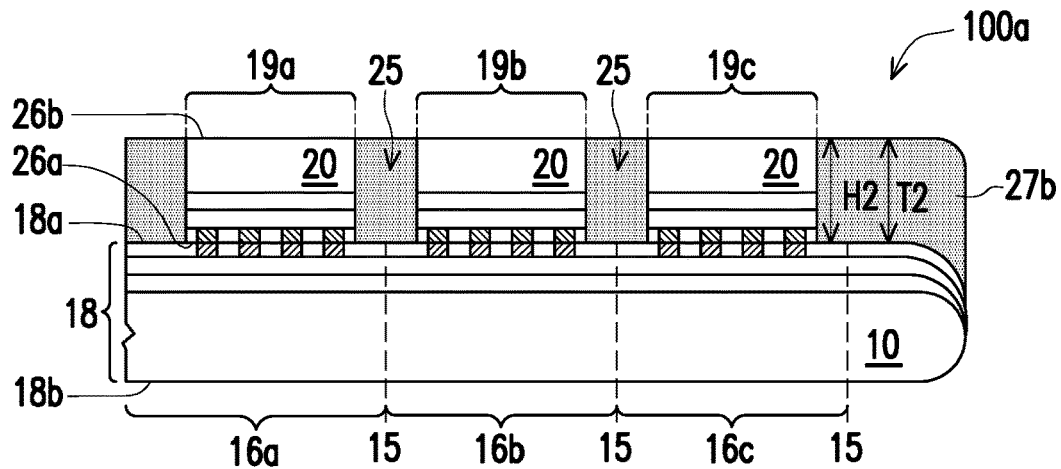

FIG. 1A to FIG. 1C are schematic cross-sectional views illustrating a method of forming a semiconductor package structure according to a first embodiment of the disclosure. In some embodiments, the semiconductor package structure includes a three dimensional integrated chip (3DIC) structure.

Referring to FIG. 1A, a wafer 18 including a plurality of dies 16a, 16b and 16c is provided. The dies 16a, 16b and 16c may respectively be an application-specific integrated circuit (ASIC) chip, an analog chip, a sensor chip, a wireless and radio frequency chip, a voltage regulator chip or a memory chips, for example. The dies 16a, 16b and 16c may be the same types of dies or the different types of dies. The number of the dies formed in the wafer 18 shown in FIG. 1A is merely for illustration, and the disclosure is not limited thereto. In some embodiments, the wafer 18 includes a plurality of dies arranged in an array, and the number of the dies may be adjusted according to design of products. In some embodiments, the dies 16a, 16b and 16c may be separated along scribe lines 15 by a die-saw process. In some embodiments, the die 16c is adjacent to an edge of the wafer 18, and the dies 16a and 16b are away from the edge of the wafer 18. In some embodiments, the edge of the wafer 18 has a rounded shape, or an arced shape.

In some embodiments, the wafer 18 includes a substrate 10, a device layer 11, a metallization structure 12, a passivation layer 13 and a plurality of pads 14. The substrate 10 is a semiconductor substrate such as a silicon substrate. The substrate 10 is, for example, a bulk silicon substrate, a doped silicon substrate, an undoped silicon substrate, or a silicon-on-insulator (SOI) substrate. The dopant of the doped silicon substrate may be an N-type dopant, a P-type dopant or a combination thereof. The substrate 10 may also be formed by the other semiconductor materials. The other semiconductor materials include but are not limited to silicon germanium, silicon carbide, gallium arsenide, or the like. The substrate 10 includes active areas and isolation structures (not shown).

The device layer 11 includes a wide variety of devices (not shown) formed on the active areas of the substrate 10. In some embodiments, the devices include active components, passive components, or a combination thereof. In some embodiments, the devices include integrated circuit devices, for example. In some embodiments, the devices are, for example, transistors, capacitors, resistors, diodes, photodiodes, fuse devices, or other similar devices. That is to say, the wafer 18 is a wafer with devices formed in it, instead of a carrier. The metallization structure 12 is formed over the substrate 10 and the device layer 11. In some embodiments, the metallization structure 12 includes one or more dielectric layers and interconnection structures formed therein (not shown). The interconnection structures include multiple layers of contacts, conductive lines and plugs, and are electrically connected to the devices in the device layer 11.

The pads 14 are formed on the metallization structure 12. The pads 14 are electrically connected to the interconnection structure in the metallization structure 12 to provide an external connection of the devices in the device layer 11. The material of the pads 14 may include metal or metal alloy, such as aluminum, copper, nickel, or alloys thereof.

The passivation layer 13 is formed over the metallization structure 12 and aside the pads 14 to cover the sidewalls of the pads 14. In some embodiments, the passivation layer 13 is also referred as a dielectric layer. The passivation layer 13 may be a single layer structure or a multilayer structure. The passivation layer 13 includes an insulating material such as silicon oxide, silicon nitride, polymer, or a combination thereof. The polymer is, for instance, polybenzoxazole (PBO), polyimide, benzocyclobutene (BCB), a combination thereof, or the like. In some embodiments, the top surface of the passivation layer 13 is substantially level with the top surface of the pads 14. The top surface of the passivation layer 13 and the top surface of the pads 14 form an active surface of the wafer 18. In some embodiments, the active surface is referred as a first surface 18a (or referred as front surface) of the wafer 18, and a second surface 18b (or referred as back surface) of the wafer 18 (bottom surface) is opposite to the first surface 18a.

In other words, the die 16a, 16b or 16c respectively includes the substrate 10, the device layer 11, the metallization structure 12, the passivation layer 13, and the pads 14. The pads 14 are electrically connected to the devices in the device layer 11 through the interconnection structure of the metallization structure 12.

Still referring to FIG. 1A, a plurality of dies 19a, 19b and 19c are bonded to the wafer 18 through a chip on wafer (CoW) bonding process, for example. In some embodiments, the die 19a and the die 16a, the die 19b and the die 16b, the die 19c and the die 16c are bonded together respectively. In some embodiments, the die 19c is adjacent to the edge of the wafer 18, and referred as an edge die. The die 19a and 19b are far away from the edge of the wafer 18. In some embodiments, the dies 19a, 19b and 19c respectively include an active component, or a passive component. The dies 19a, 19b and 19c may respectively be an application-specific integrated circuit (ASIC) chip, an analog chip, a sensor chip, a wireless and radio frequency chip, a voltage regulator chip or a memory chips, for example. The dies 19a, 19b, and 19c may be the same types of dies or the different types of dies.

In some embodiments, the dies 19a, 19b and 19c are dies cut from a wafer or a plurality of wafers by die-saw processes. That is, the dies 19a, 19b and 19c may be cut from a same wafer or different wafers. Before the dies 19a, 19b and 19c are singulated, a polishing process may be performed for thinning the wafer. Thereafter, the dies 19a, 19b and 19c are bonded to the wafer 18. In some embodiments, a grinding process is then performed for further thinning the dies 19a, 19b and 19c.

In some embodiments, the dies 19a, 19b and 19c respectively includes a substrate 20, a device layer 21, a metallization structure 22, a passivation layer 23 and a plurality of pads 24. In some embodiments, the materials and the structural characteristics of the substrate 20, the device layer 21, the metallization structure 22, the passivation layer 23 and the pads 24 are similar to or different from those of the substrate 10, the device layer 11, the metallization structure 12, the passivation layer 13 and the pads 14.

The dies 19a, 19b and 19c may have the same size or different sizes. In some embodiments in which the dies 19a, 19b and 19c have the same size, the dies 19a, 19b and 19c have substantially the same height H1 and the same width W1. That is to say, the top surfaces of the dies 19a, 19b and 19c are substantially level with each other. The height H1 of the die 19a, 19b and 19c ranges from 5 μm to 775 μm. In one embodiment, the height H1 is 20 μm, for example. The width W1 of the die 19a, 19b and 19c ranges from 1 mm to 30 mm. In one embodiment, the width W1 of the die 19a is 5 mm, 10 mm or 20 mm, for example. In some embodiments, a plurality of gaps 25 are existed between the dies 19a, 19b, and 19c. That is to say, the dies 19a, 19b and 19c are discrete located on the wafer 18. The width W2 of the gap 25, that is, the distance between the adjacent dies 19a and 19b, or 19b and 19c, ranges from 30 μm to 1 mm.

The dies 19a, 19b, and 19c respectively have a first surface 26a (that is, the bottom surface) and a second surface 26b (that is, the top surface) opposite to each other. In some embodiments, the first surface 26a (or referred as front surface) is an active surface of the die 19a, 19b or 19c including a surface of the passivation layer 23 and a surface of the pads 24. The second surface 26b (or referred as back surface) is the top surface of the substrate 10 of the die 19a, 19b, or 19c. In some embodiments, the first surfaces 26a of the dies 19a, 19b, and 19c are bonded to the first surfaces 18a of the wafer 18. That is, the dies 19a/19b/19c and the wafer 18 are respectively configured as face to face.

In some embodiments, the dies 19a, 19b and 19c are aligned with the dies 16a, 16b and 16c, respectively. The pads 24 are aligned with the pads 14, the passivation layers 23 are aligned with the passivation layer 13, but the disclosure is not limited thereto. In some embodiments, the dies 19a, 19b and 19c are bonded to the wafer 18 by a suitable bonding method such as a hybrid bonding, a fusion bonding, or a combination thereof. In some embodiments, as shown in FIG. 1A, one die 19a, 19b or 19c is respectively bonded to one die 16a, 16b or 16c of the wafer 18, but the disclosure is not limited thereto. In some other embodiments, two or more dies may be bonded to one die 16a, 16b or 16c of the wafer 18 (not shown).

In some embodiments in which the bonding method includes a hybrid bonding, the hybrid bonding involves at least two types of bonding, including metal-to-metal bonding and non-metal-to-non-metal bonding such as dielectric-to-dielectric bonding. That is to say, the pads 24 and the pads 14 are bonded by metal-to-metal bonding, the passivation layer 23 and the passivation layer 13 are bonded by dielectric-to-dielectric bonding.

In some embodiments in which the bonding method includes a fusion bonding, the bonding operation of fusion bonding may be performed as follows. First, to avoid the occurrence of the unbonded areas (i.e. interface bubbles), the to-be-bonded surfaces of the dies 19a, 19b and 19c and the wafer 18 (that is, the first surfaces 26a of the dies 19a, 19b and 19c, and the first surface 18a of the wafer 18) are processed to be sufficiently clean and smooth. Then, the dies 19a, 19b, and 19c and the dies 16a, 16b and 16c of the wafer 18 are aligned and placed in physical contact at room temperature with slight pressure to initiate a bonding operation. Thereafter, an annealing process at elevated temperatures is performed to strengthen the chemical bonds between the to-be-bonded surfaces of the dies 19a, 19b and 19c and the wafer 18 and to transform the chemical bonds into covalent bonds.

In some other embodiments, the dies 19a, 19b and 19c may be bonded to the wafer 18 though a plurality of connectors (not shown), and an underfill layer may be formed to fill the space between the dies 19a, 19b, 19c and the wafer 18, and surround the connectors. The connectors are located between the pads 14 and the pads 24, such that the dies 19a, 19b, and 19c are electrically connected to the wafer 18, respectively. The connector may be conductive bumps such as solder bumps, silver balls, copper balls, gold bumps, copper bumps, copper posts, or any other suitable metallic bumps or the like.

Referring to FIG. 1B, after the dies 19a, 19b and 19c are bonded to the wafer 18, a dielectric material layer 27 is formed over the wafer 18 and the dies 19a, 19b and 19c. The dielectric material layer 27 covers the top surface of the wafer 18, and the top surfaces and the sidewalls of the dies 19a, 19b and 19c. That is to say, the gaps 25 between the dies 19a, 19b, and 19c are filled with the dielectric material layer 27, and the dielectric material layer 27 is also referred as a gap-fill dielectric layer. In some embodiments, the gaps 25 are filled up with the dielectric material layer 27. In some embodiments, the material of the dielectric material layer 27 includes a molding compound, a molding underfill, a resin such as epoxy, a combination thereof, or the like. The forming method of the dielectric material layer 27 includes a molding process, a molding underfilling (MUF) process, or a combination thereof.

In some embodiments, the dielectric material layer 27 has a substantially flat top surface. In some embodiments, the sidewalls of the dielectric material layer 27 on edges of the wafer 18 are substantially straight. The thickness T0 of the dielectric material layer 27 is greater than the height H1 of the die 19a, 19b or 19c. In some embodiments, the thickness T0 of the dielectric material layer 27 is greater than 5 μm and less than or equal to 800 μm. Here, the thickness T0 refers to the thickness of the dielectric material layer 27 from the top surface of the wafer 18 to the top surface of the dielectric material layer 27. In some embodiments in which the edge of the wafer 18 is rounded or arced, the dielectric material 27 may extend to cover a portion of sidewalls of the edge of the wafer 18. Thus, the thickness of the portion of the dielectric material layer 27 on edge of the wafer 18 is thicker than the thickness T0.

In some embodiments, the dielectric material layer 27 includes a body part 28 and a protrusion 29. The body part 28 is located on the wafer 18 and aside the dies 19a, 19b and 19c, surrounding and covering sidewalls of the dies 19a, 19b and 19c. In some embodiments, the top surface of the body part 28 is substantially level with the second surfaces of the dies 19a, 19b and 19c. The protrusion 29 is located on the body part 28 and on the dies 19a, 19b and 19c, covering the second surfaces 26b of the dies 19a, 19b and 19c and the top surface of the body part 28. In some embodiments, the protrusion 29 is a continuous layer over the wafer 18, and the width of the protrusion 29 is substantially the same as the width of the wafer 18.

Referring to FIG. 1C, thereafter, a planarization process is performed to remove a portion of the dielectric material layer 27 on the second surfaces 26b of the dies 19a, 19b and 19c, such that the second surfaces 26b (that is, the top surfaces) of the dies 19a, 19b and 19c are exposed, and a dielectric layer 27b is formed. In some embodiments, portions of the substrate 20 of the dies 19a, 19b and 19c are also removed during the planarization process, and the height of the die 19a, 19b or 19c are reduced from H1 to H2. In some embodiments, the height H2 is greater than 1 μm and less than or equal to 100 μm. In the embodiment in which the height H1 is 20 μm, the height H2 is 10 μm. However, the disclosure is not limited thereto, in some other embodiments, the substrates 20 are not removed during the planarization process. In some embodiments, the planarization process includes a chemical mechanical polishing (CMP) process, for example.

Still referring to FIG. 1C, in some embodiments, the top surface of the dielectric layer 27b is substantially level with the second surfaces 26b of dies 19a, 19b and 19c. In other words, the protrusion 29 is removed during the planarization process. In some embodiments in which portions of the dies 19a, 19b and 19c are removed, the protrusion 29 and a portion of the body part 28 of the dielectric material layer 27 are removed, and the dielectric layer 27b has a thickness T2. The value of the thickness T2 of the dielectric layer 27b is substantially the same as the value of the height H2 of the die 19a, 19b or 19c. In other words, the dielectric layer 27b has the same plane with the discrete dies 19a, 19b and 19c.

Still referring to FIG. 1C, a semiconductor package structure 100a is thus completed, the semiconductor package structure 100a includes a wafer 18, a plurality of dies 19a, 19b and 19c, and a dielectric layer 27b. The dies 19a, 19b and 19c are bonded to the wafer 18. The dielectric layer 27b is formed on the wafer 18 and aside the dies 19a, 19b and 19c. The dielectric layer 27b fills in the gaps 25 between the dies 19a, 19b and 19c, so as to cover a portion of the first surface 18a of the wafer 18, and cover the sidewalls of the dies 19a, 19b and 19c. In other words, the die 19a, 19b or 19c is surrounded and protected by the dielectric layer 27b. The second surfaces 26b of the dies 19a, 19b and 19c are exposed, and subsequent processes may be performed to stack more components or devices on the semiconductor package structure 100a.

Figure 2A:
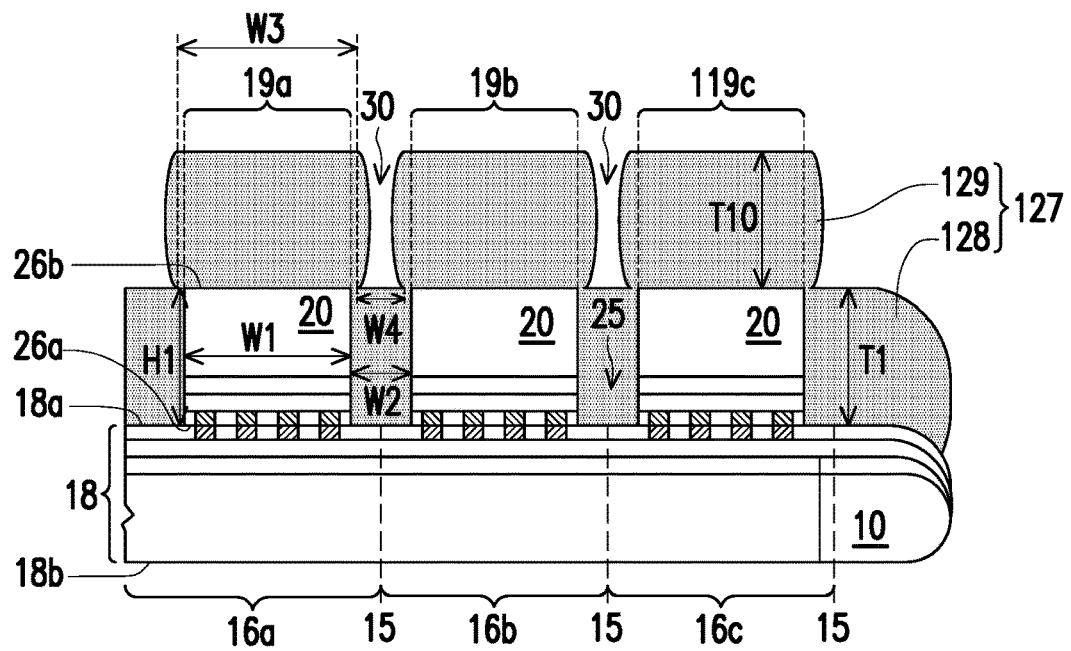
FIG. 2A to FIG. 2C are schematic cross-sectional views illustrating a method of forming a semiconductor package structure according to a second embodiment of the disclosure.
Figure 2B:
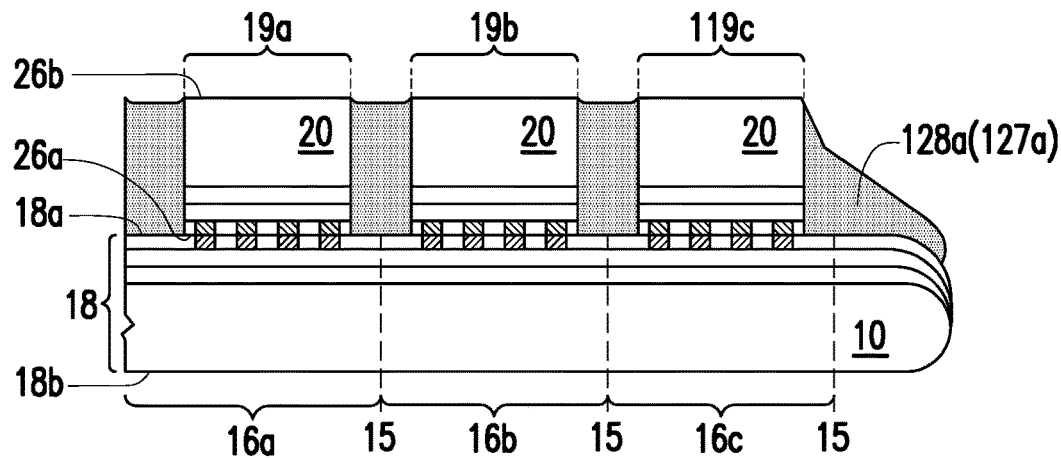
Figure 2C:
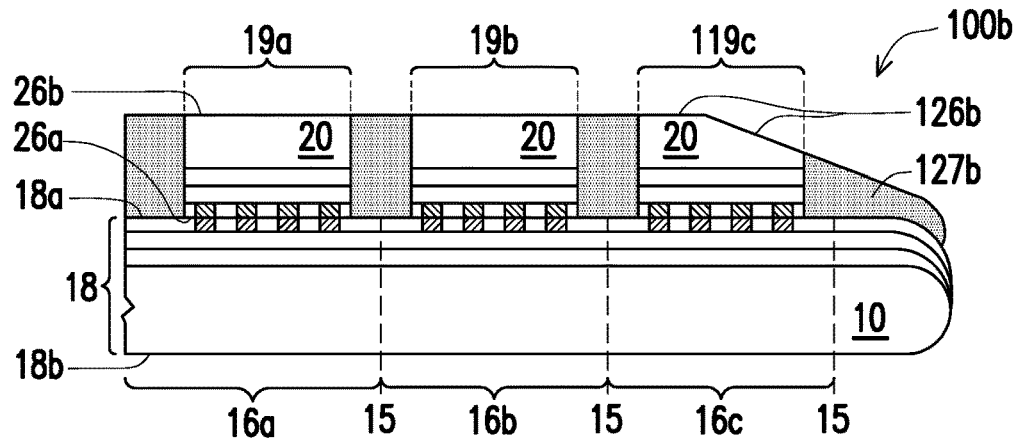

FIG. 2A to FIG. 2C are schematic cross-sectional views illustrating a method of forming a semiconductor package structure according to a second embodiment of the disclosure. The second embodiment differs from the first embodiment in that a dielectric material layer 127 is formed on a wafer 18 and on dies 19a, 19b and 119c, and the material and the forming method of the dielectric material layer 127 are different from those of the dielectric material layer 27.

Referring to FIG. 1A and FIG. 2A, processes similar to those of FIG. 1A are performed, such that the dies 19a, 19b and 119c are bonded to the wafer 18. The die 119c is aside the dies 19a, 19b and on the edge of the wafer 18, that is, the die 119c is closer to the edge or the end of the wafer 18. The dielectric material layer 127 is formed over the wafer 18, so as to cover a portion of the first surface 18a of the wafer 18, and cover the second surfaces 26b and the sidewalls of the dies 19a, 19b and 119c. In some embodiments, the material of the dielectric material layer 127 includes an inorganic dielectric material, an organic dielectric material, or a combination thereof. The inorganic dielectric material includes oxide such as silicon oxide, nitride such as silicon nitride, oxynitride such as silicon oxynitride, silicon carbonitride (SiCN), silicon carbon oxide (SiCO), or a combination thereof. The organic dielectric material includes polymer such as polybenzoxazole (PBO), polyimide, benzocyclobutene (BCB), epoxy, a combination thereof, or the like. The forming method of the dielectric material layer 127 includes a deposition process such as chemical vapor deposition (CVD), plasma-enhanced chemical vapor deposition (PECVD), or the like.

Still referring to FIG. 2A, the surface or the topography of the dielectric material layer 127 is undulated. In some embodiments, the topography of the dielectric material layer 127 is similar to the dies 19a, 19b and 119c on the wafer 18. In some embodiments, the dielectric material layer 127 includes a body part 128 and a plurality of protrusions 129. The body part 128 is located on the wafer 18 and aside the dies 19a, 19b and 119c, covering a portion of the first surface 18a of the wafer 18 and the sidewalls of the dies 19a, 19b and 119c. That is, the gaps 25 between the dies 19a, 19b and 119c are filled with the dielectric material layer 127. In some embodiments, the gaps 25 are filled up with the dielectric material layer 127. The edge of the body part 128 covers the edge of the wafer 18, and has a shape similar to that of the edge of the wafer 18. The protrusions 129 are located over the body part 128 and respectively on the dies 19a, 19b and 119c, so as to cover the second surfaces 26b of the dies 19a, 19b and 119c and a portion of the top surface of the body part 128. In other words, the top corners of the dies 19a, 19b and 119c are covered by the dielectric material layer 127. In some embodiments, the number of the protrusions 129 is the same as the number of the dies 19a, 19b and 119c on the wafer 18. The cross-section shape of the protrusion 129 may be square, rectangle, rectangle with arced sidewall, square with arced sidewall or trapezoid, for example. However, the disclosure is not limited thereto, the cross-section shape of the protrusion 129 may be any other shapes, as long as the second surfaces 26b and the top corners and the sidewalls of the dies 19a, 19b and 19c are covered. In some embodiments, the thickness T1 of the body part 128 is substantially the same as the height H1 of the dies 19a or 19b. The thickness T10 of the protrusion 129 may be the same as or different from the thickness T1 of the body part 128.

In some embodiments, the sidewalls of the protrusion 129 are arc shaped, and the width of the protrusion 129 is increased and then decreased gradually from top to bottom. That is to say, the protrusion 129 has a greatest width at a middle region from top to bottom. In some embodiments, the bottom width W3 of the protrusion 129 is greater than the width W1 of the die 19a, 19b or 119c. That is to say, the protrusion 129 covers the top surface of the die 19a, 19b or 119c and a portion of the top surface of the body part 128 around the die 19a, 19b or 119c. In some embodiments, the top surfaces of the dies 19a, 19b and 119c are completely covered by the protrusions 129. In some embodiments, the ratio of the bottom width W3 to the width W1 ranges from 1 to 1.5.

Still referring to FIG. 2A, in some embodiments, a plurality of gaps 30 are existed between the adjacent protrusions 129. The gap 30 is located over the gap 25, and a portion of the top surface of the body part 128 is exposed by the gap 30. In some embodiments, the width of the gap 30 is decreased and then increased from top to bottom. The bottom width W4 of the gap 30 is less than the width W2 of the gap 25. The cross-section shape of gap 30 may be rectangle, trapezoid, narrow vase-like shaped, for example.

Referring to FIG. 2B, the protrusions 129 of the dielectric material layer 127 are removed, such that the second surfaces of the dies 19a, 19b and 119c are exposed, and a dielectric material layer 127a including a body part 128a is remained. The protrusions 129 are removed by a first planarization process, such as a CMP process. In some embodiments, a portion of the body part 128 is also removed during the planarization process, and a slight dishing may occur in the body part 128a. In some embodiments, a great amount of the body part 128 of the dielectric material layer 127 on the edge of the wafer 18 is removed, and the sidewall of the die 119c (the edge die) adjacent to the edge of the wafer 18 is partially exposed or damaged. The sidewalls of the dies 19a and 19b and the sidewall of the die 119c far away from the edge of the wafer 18 are still covered and protected by the dielectric material layer 127a.

Referring to FIG. 2C, portions of the dies 19a, 19b and 119c and a portion of the body part 128a of the dielectric material layer 127a are removed, and a dielectric layer 127b is formed. The removal method includes a second planarization process, such as a CMP process. In some embodiments, the top surface of the dielectric layer 127b between the dies 19a, 19b and 119c is substantially level with the second surfaces 26b of the dies 19a and 19b. In some embodiments, the portion of the top surface of the dielectric layer 127b on edge of the wafer 18 is inclined and lower than the second surfaces 26b of the dies 19a and 19b. As a large amount of the dielectric material layer 127 on the edge of the wafer 18 is removed during the first planarization process, and a portion of the sidewall of the die 119c (that is, the edge die) adjacent to the edge of the wafer 18 is not covered and protected by the dielectric material layer 127a, the die 119c may be further damaged and suffer from a topography degradation during the second planarization process. That is to say, a portion of the die 119c not covered by the dielectric material layer 127a are removed, and a die 119c with a top surface 126b is formed. A portion of the top surface 126b of the die 119c adjacent to the die 19b is level with the second surfaces 26b of the dies 19a and 19b, and another portion of the top surface 126b adjacent to the edge of the wafer 18 is inclined and lower than the second surfaces 26b. In some embodiments, the die 119c is a dummy die formed on the edge of the wafer 18, such that the dies 19a and 19b are laterally protected from being damaged during the first and second planarization processes. In some embodiments, the dummy die 119c does not include devices or metallization structures. Herein, when elements are described as "dummy", the elements are electrically floating or electrically isolated from other elements.

Figure 3:
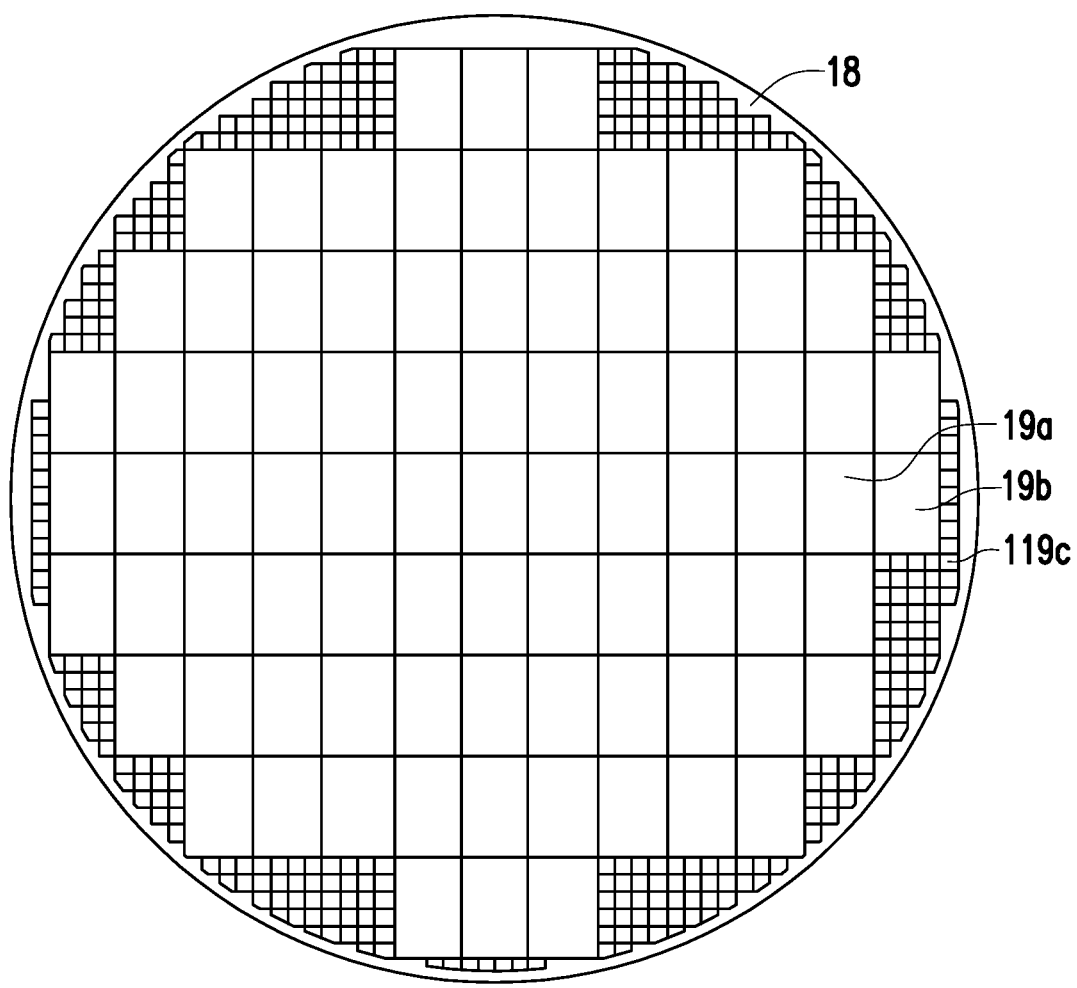
FIG. 3 is a top view of the semiconductor package structure shown in FIG. 2C according to some embodiments of the disclosure.

FIG. 3 is a top view of the structure shown in FIG. 2C according to some embodiments of the disclosure. It is noticed that, for the sake of brevity, only one edge of the wafer 18 and three dies 19a, 19b and 119c are shown in FIG. 2C. Referring to FIG. 3, the wafer 18 includes a plurality of dies 19a/19b and a plurality of dummy dies 119c formed therein. The dummy dies 119c are formed on the edge of the wafer 18 to surround the dies 19a and 19b. In some embodiments, the dies 19a and 19b are effective dies and are protected by the dummy dies 119c during the planarization processes. In some embodiments, the sizes of the dummy dies 119c are less than or equal to the size of the die 19a or 19b. The dummy dies 119c may have the same size or different sizes.

Referring to FIG. 2C and FIG. 3, a semiconductor package structure 100b is thus completed. The semiconductor package structure 100b differs from the semiconductor package structure 100a in that a plurality of dummy dies 119c are formed on the edge of the wafer 18 to protect the effective dies 19a and 19b. The other structural characteristics of the semiconductor package structure 100b are substantially the same as those of the semiconductor package structure 100a, which is not described again.

FIG. 4A to FIG. 4D are schematic cross-sectional views illustrating a method of forming a semiconductor package structure according to a third embodiment of the disclosure. The third embodiment differs from the second embodiment in that a mask layer 32 is formed after a dielectric material layer 127 is formed. The details are described as below.

Figure 4A:
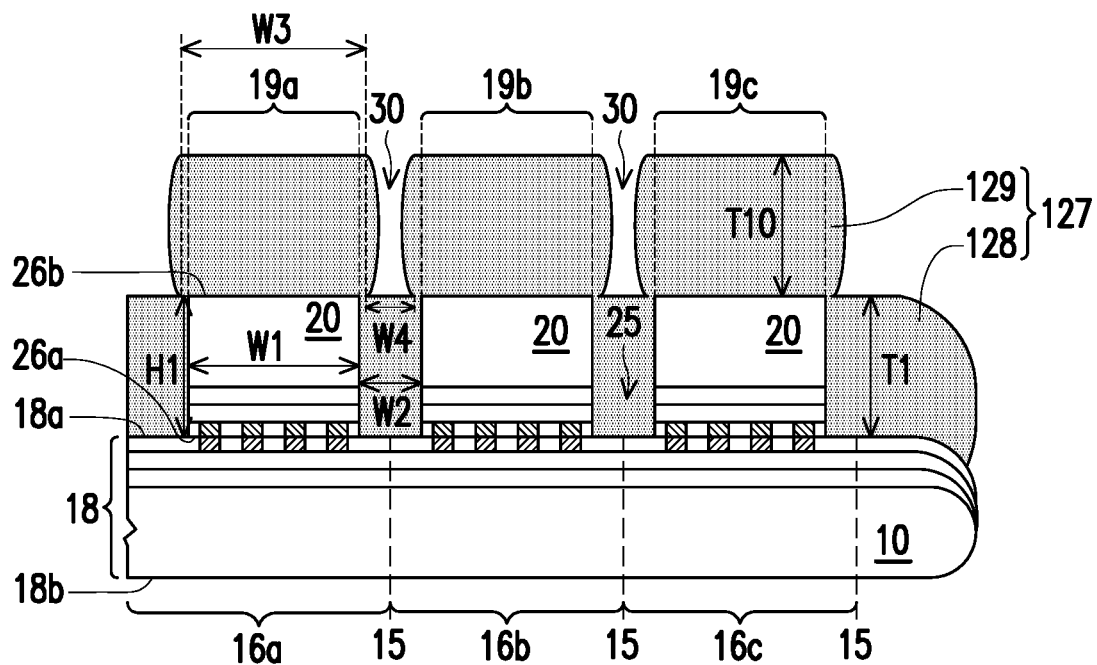
FIG. 4A to FIG. 4D are schematic cross-sectional views illustrating a method of forming a semiconductor package structure according to a third embodiment of the disclosure.

Referring to FIG. 4A, after the dies 19a, 19b and 19c are bonded to the wafer 18 by the processes described in FIG. 1A of the first embodiment, processes similar to FIG. 2A is performed, and the dielectric material layer 127 is formed over the wafer 18. The dielectric material layer 127 includes a body part 128 and a plurality of protrusions 129, and a plurality of gaps 30 are located between the protrusions 129. The material, forming method and the structural characteristics of the dielectric material layer 127 are similar to those described in the second embodiment.

Figure 4B:
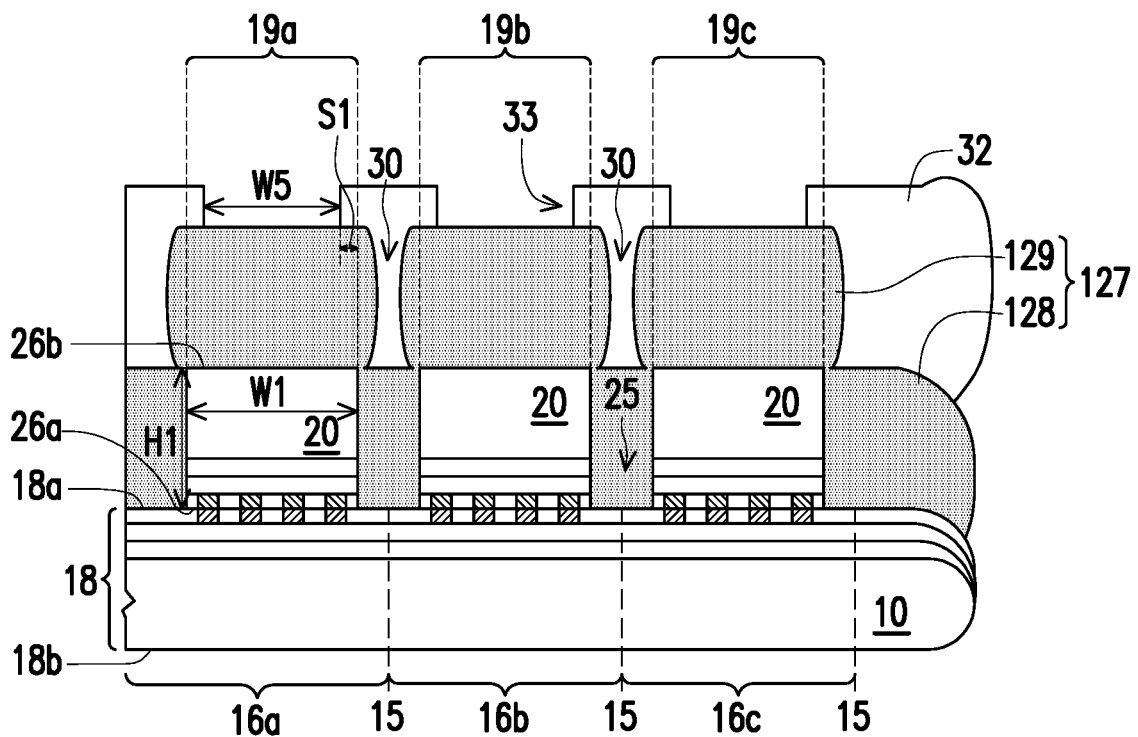

Referring to FIG. 4B, a mask layer 32 is formed over the wafer 18. The mask layer 32 is disposed on the body part 128 and aside the protrusions 129 of the dielectric material layer 127. The mask layer 32 fills in the gaps 30 between the protrusions 129 of the dielectric material layer 127, and protrudes from the top surfaces of the protrusions 129. In some embodiments, the mask layer 32 covers a portion of the top surface of the body part 128, and the sidewalls and portions of the top surfaces of the protrusions 129. The body part 128 on the edge of the wafer 18 is also covered by the mask layer 32.

The mask layer 32 has a plurality of openings 33, exposing portions of top surfaces of the protrusions 129. The openings 33 are located at the corresponding positions over the dies 19a, 19b and 19c. In some embodiments, the width W5 of the opening 33 is equal or less than the width W1 of the die 19a, 19b or 19c. The width W5 is dependent on the width W1 of the die 19a, 19b or 19c. In some embodiments, the distance S1 between the sidewall of the opening 33 to the adjacent sidewall of the die 19a, 19b or 19c ranges from 1 µm to 100 µm. In one embodiment, the distance S1 is 20 µm.

In some embodiments, the mask layer 32 is a patterned photoresist, for example. The mask layer 32 is formed by, for example, forming a photoresist layer on the dielectric material layer 127 at first, the photoresist layer fills into the gap 30 and covers the top surfaces of the protrusions 129. Thereafter, exposure and development processes are performed on the photoresist layer.

Figure 4C:
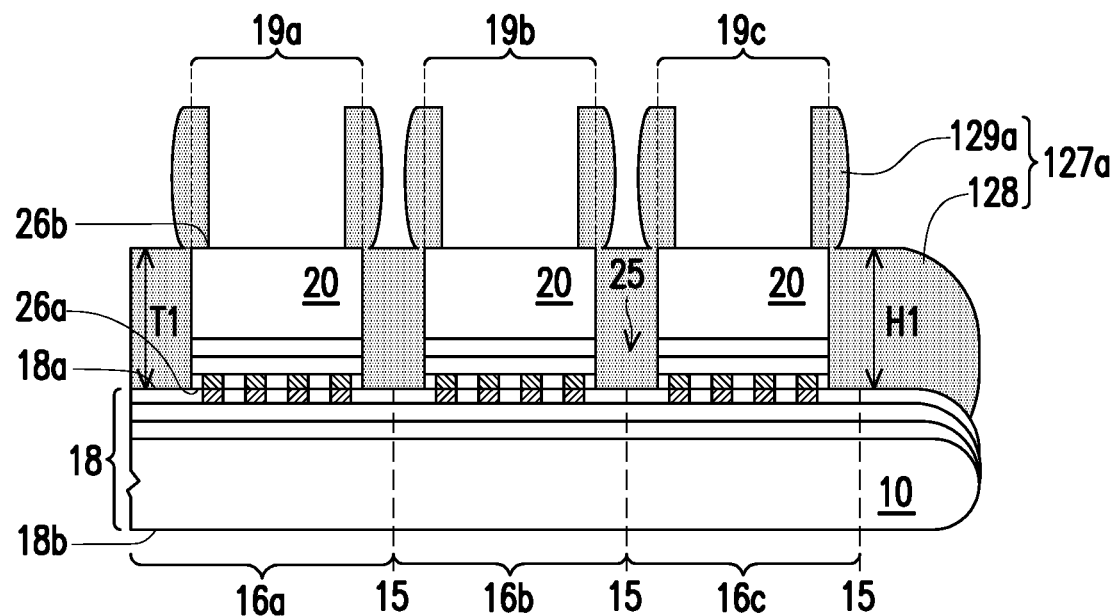

Referring to FIG. 4B and FIG. 4C, a removal process is performed, and portions of the protrusions 129 exposed by the openings 33 are removed with the mask layer 32 as a mask, and a dielectric material layer 127a is formed. In some embodiments, after the removal process is performed, portions of the second surfaces 26a of the dies 19a, 19b and 19c are exposed. However, the disclosure is not limited thereto, in some other embodiments, after the removal process is performed, the second surfaces 26a of the dies 19a, 19b and 19c are not exposed. The removal method includes an etching process. The etching process may be an anisotropic etching process, an isotropic etching process, or a combination thereof. In some embodiments, the etching process includes a wet etching process, a dry etching process, or a combination thereof. Thereafter, the mask layer 32 is stripped by an ashing process, for example.

Referring to FIG. 4C, after portions of the protrusions 129 are removed, a plurality of remnants 129a are remained on the body part 128 and on the dies 19a, 19b and 19c. The remnants 129a covers portions of the second surfaces 26a of the die 19a, 19b and 19c and a portion of the top surface of the body part 128. In other words, the top corner of the dies 19a, 19b and 19c are covered by the dielectric material layer 127a. Specifically, the remnants 129a covers the top surfaces of the edges of the dies 19a, 19b and 19c, and the top surface of a portion of the body part 128 adjacent to the edges of the dies 19a, 19b and 19c. In other words, the dielectric material layer 127a covers the sidewalls and top surfaces of the edges of the dies 19a, 19b and 19c. In some embodiments, the cross-section shape of the remnant 129a is tooth-shaped, triangle, arc-shaped, for example. In some embodiments, as shown in FIG. 4C, the remnant 129a has a straight sidewall and an arced sidewall. The straight sidewall is an inner sidewall of the remnant 129a located on the dies 19a, 19b and 19c, and the arced sidewall is an outer sidewall of the remnant 129a located on the body part 128. However, the disclosure is not limited thereto, in some other embodiments, the inner sidewall of the remnant 129a is not straight, but inclined.

Figure 4D:
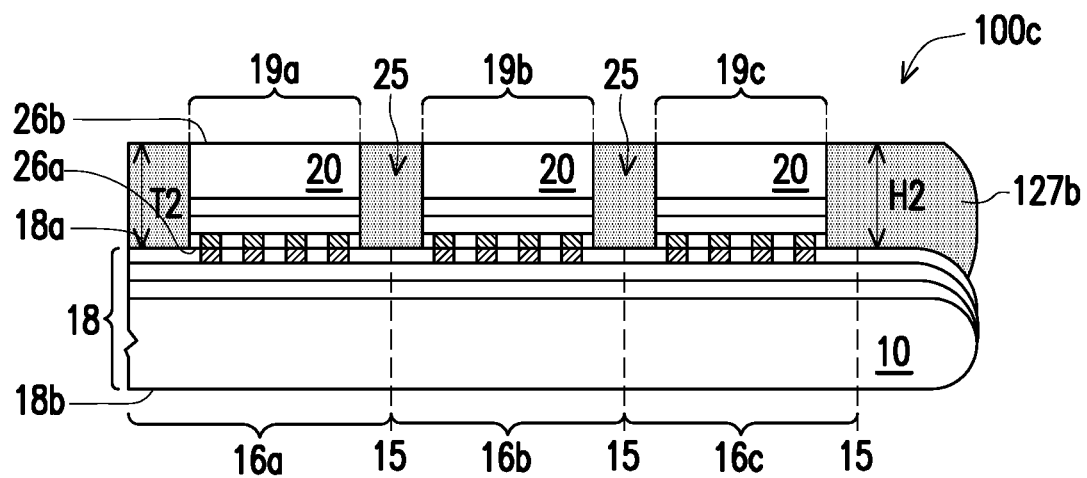

Referring to FIG. 4C and FIG. 4D, the remnants 129a and a portion of the body part 128 of the dielectric material layer 127a and portions of the dies 19a, 19b and 19c are removed, such that a dielectric layer 127b is formed, and a second surfaces 26b of the dies 19a, 19b and 19c are exposed. The dies 19a, 19b and 19c are thinned, and the height of the die 19a, 19b or 19c is reduced from H1 to H2. In some embodiments, the removal process is also referred as a thinning process. The thinning process includes a planarization process, such as a CMP process. In some embodiments, the CMP process has a high selectivity ratio of the substrate 13 to the dielectric material layer 127a.

Referring to FIG. 4D, in some embodiments, the top surface of the dielectric layer 127b is substantially level with the second surfaces 26b of the dies 19a, 19b and 19c. The thickness T2 of the dielectric layer 127b is substantially the same as the height H2 of the die 19a, 19b or 19c. The range of the thickness T2 and the height H2 are substantially the same as those described in the first embodiments. The sidewalls of the dies 19a, 19b and 19c are surrounded and covered by the dielectric layer 127b, and the second surfaces 26b of the dies 19a, 19b and 19c are exposed. In some embodiments, the sidewalls of the dielectric layer 127b on the edge of the wafer 18 is not straight, and is arced, rounded or inclined.

Still referring to FIG. 4D, the semiconductor package structure 100c is thus completed. The semiconductor package structure 100c differs from the semiconductor package structure 100a (FIG. 1C) in that, the material of the dielectric layer 127b and the shape of sidewall of the dielectric layer 127b on edge of the wafer 18 are different from those of the dielectric layer 27. The other structural characteristics of the semiconductor package structure 100c are substantially the same as those of the semiconductor package structure 100a.

Figure 5A:
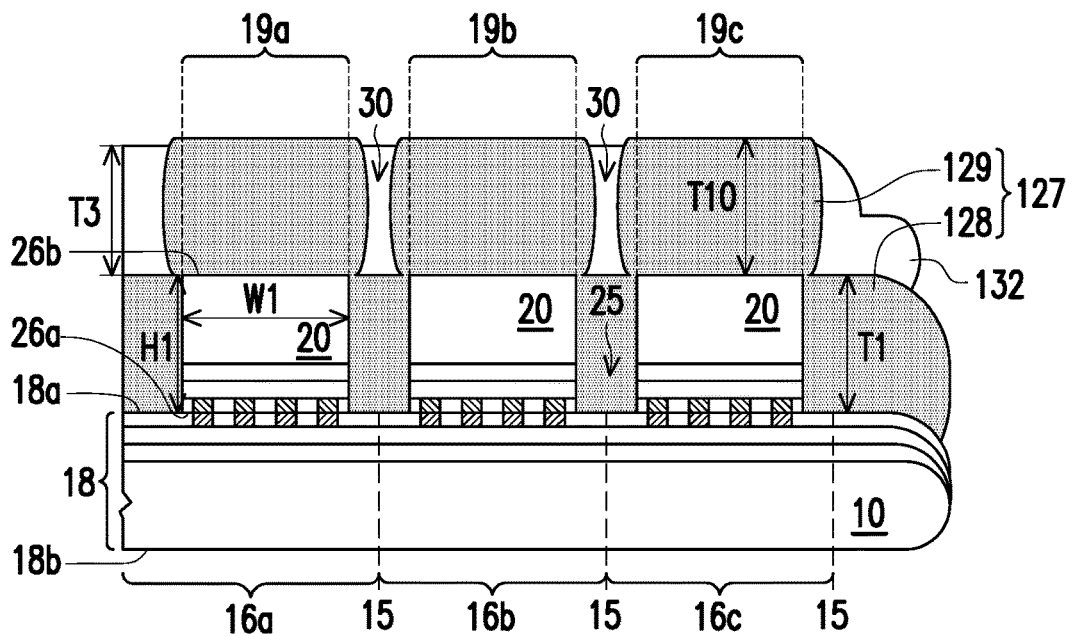
FIG. 5A to FIG. 5C are schematic cross-sectional views illustrating a method of forming a semiconductor package structure according to a fourth embodiment of the disclosure.
Figure 5B:
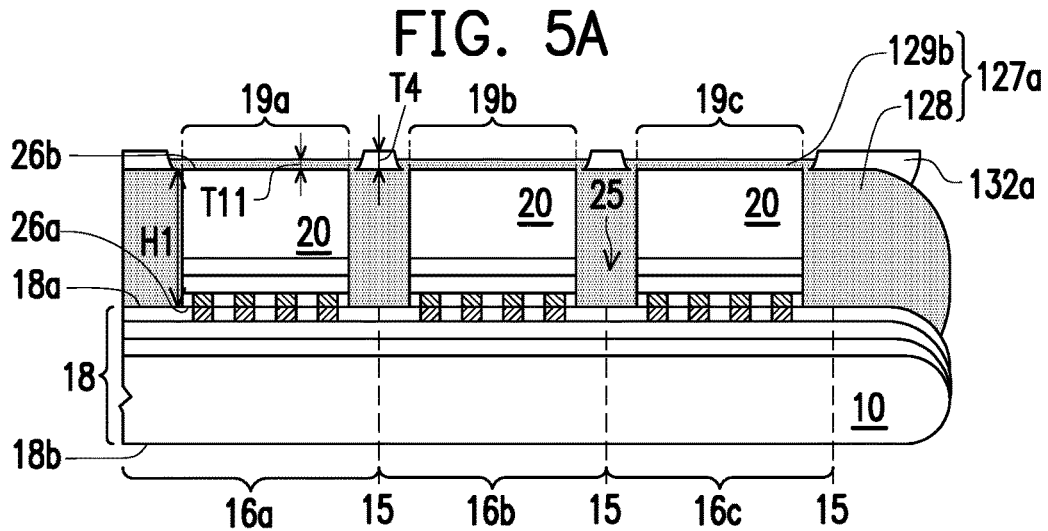
Figure 5C:
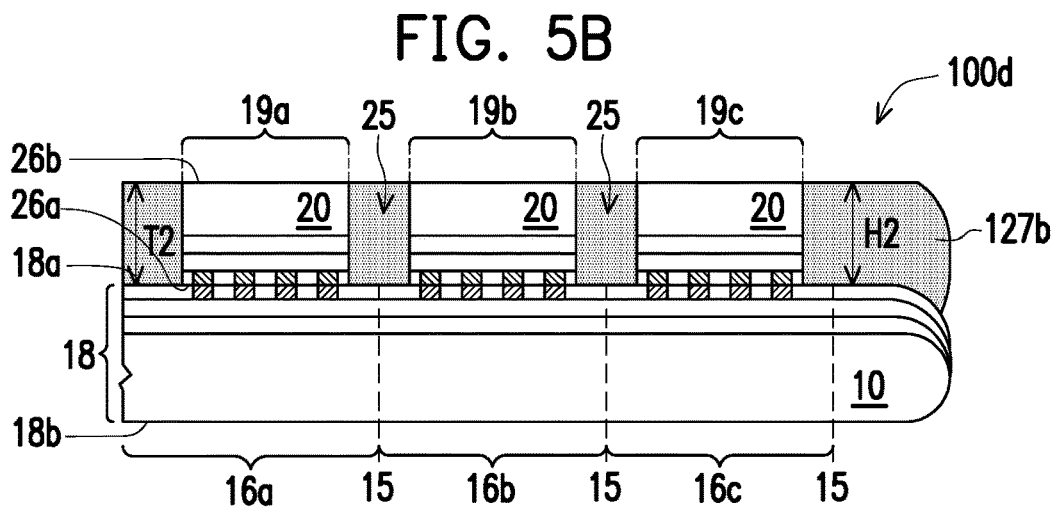

FIG. 5A to FIG. 5C are schematic cross-sectional views illustrating a method of forming a semiconductor package structure according to a fourth embodiment of the disclosure. The fourth embodiment differs from the third embodiment in that a mask layer 132 is formed in the gaps 30 between the protrusion 129s, and the mask layer 132 does not cover the top surfaces of the protrusions 129. In other words, the mask layer 132 is formed on the body part 128, covering the top surface of the body part 128 and sidewalls of the protrusions 129.

Referring to FIG. 4A and FIG. 5A, after a dielectric material layer 127 is formed over a wafer 18 and dies 19a, 19b and 19c, a mask layer 132 is formed on the body part 128 and aside the protrusions 129 of the dielectric material layer 127. The structural characteristics and the thickness range of the dielectric material 127 are substantially the same as those described in the third embodiment shown in FIG. 4A. The mask layer 132 fills in the gaps 30 between the protrusions 129 of the dielectric material layer 127. In some embodiments, the top surface of the mask layer 132 is slightly lower than the top surfaces the protrusion 129. The material of the mask layer 132 is photoresist, for example. The mask layer 132 is formed by, for example, forming a photoresist material layer over the dielectric material layer 127 by spin-coating at first. The photoresist material layer covers sidewalls and top surfaces of the dielectric material layer 127. Thereafter, a portion of the photoresist material layer on the top surface of the dielectric material layer 127 is removed, such that the top surfaces of the protrusions 129 are exposed. The removal method of the photoresist material layer includes an etching process, such as an etching back process.

Referring to FIG. 5A and FIG. 5B, portions of the protrusions 129 and a portion of the mask layer 132 are removed, such that a dielectric material layer 127a and a mask layer 132a are formed. The dielectric material layer 127a includes the body part 128 and a plurality of protrusions 129b. In some embodiments, the removal method includes an etching process, such as a blanket etching process. That is, the removal method is performed to reduce the thickness of the protrusion 129 and the mask layer 132. In some embodiments, the thickness of the protrusion 129b is reduced from T10 to T11. In some embodiments, the thickness of the mask layer 132a is reduced from T3 to T4. The top surfaces of the dies 19a, 19b and 19c are covered by the protrusions 129b, the top surface of the body part 128 of the dielectric material layer 127a is covered by the mask layer 132a and the protrusions 129b.

Referring to FIG. 5B and FIG. 5C, the mask layer 132a is stripped. The protrusions 129b and a portion of the body part 128 of the dielectric material layer 127a, and portions of the dies 19a, 19b and 19c are removed, such that a dielectric layer 127b is formed, and the top surface of the dielectric layer 127b is substantially level with the second surfaces 26b of the dies 19a, 19b and 19c. The removal method includes a planarization process, such as a CMP process. A semiconductor package structure 100d is thus completed. The structural characteristics of the semiconductor package structure 100d is substantially the same as those of the semiconductor package structure 100c, which is not described again.

FIG. 6A to FIG. 6D are schematic cross-sectional views illustrating a method of forming a semiconductor package structure according to a fifth embodiment of the disclosure. The fifth embodiment differs from the third embodiments in that, a hard mask 35a is formed on the sidewalls of the protrusions 129 and on the top surface of the body part 128 of the dielectric material layer 127.

Figure 6A:
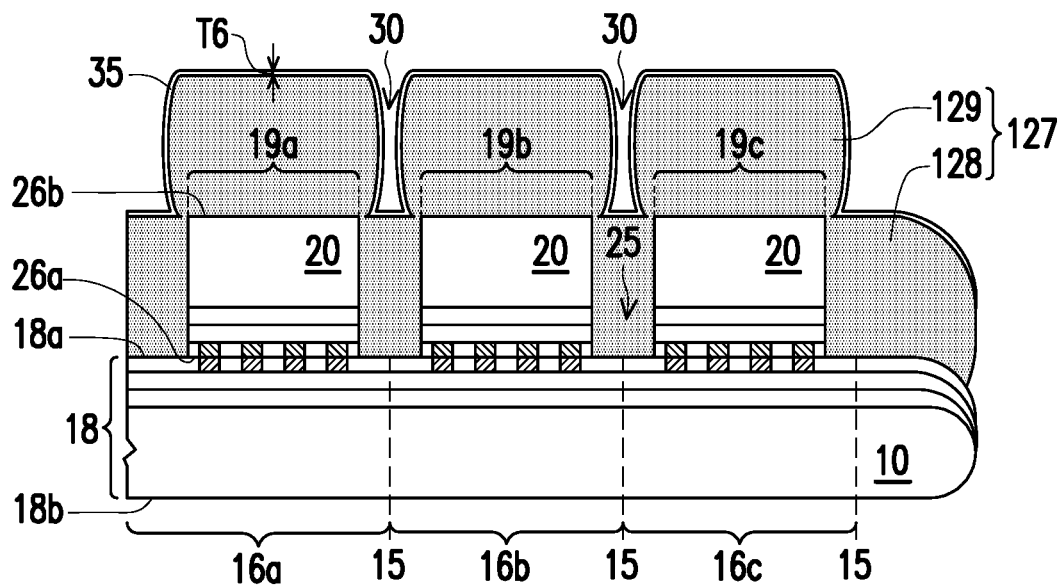
FIG. 6A to FIG. 6D are schematic cross-sectional views illustrating a method of forming a semiconductor package structure according to a fifth embodiment of the disclosure.

Referring to FIG. 4A and FIG. 6A, after the dielectric material layer 127 is formed over a wafer 18 and dies 19a, 19b and 19c, a hard mask layer 35 is formed on the dielectric material layer 127. In some embodiments, the hard mask layer 35 is a conformal hard mask layer. That is, the hard mask layer 35 has a substantially equal thickness extending along the region on which the dielectric material layer 127 is formed. In some embodiments, the thickness T6 of the hard mask layer 35 ranges from 100 angstroms to 3000 angstroms. The material of the hard mask layer 35 is different from the material of the dielectric material layer 127. In some embodiments, the material of the hard mask layer 35 includes silicon nitride, silicon oxide, silicon oxynitride, or a combination thereof. In alternative embodiments, the hard mask layer 35 includes a conductive material. The conductive material includes a metal, metal nitride, or a combination thereof. In some embodiments, the hard mask layer 35 includes titanium nitride, tantalum nitride, titanium, tantalum, boron nitride, or a combination thereof. The forming method of the hard mask layer 35 includes a deposition process, such as physical vapor deposition (PVD), chemical vapor deposition (CVD), plasma enhanced CVD (PECVD), atomic layer deposition (ALD), or the like.

Figure 6B:
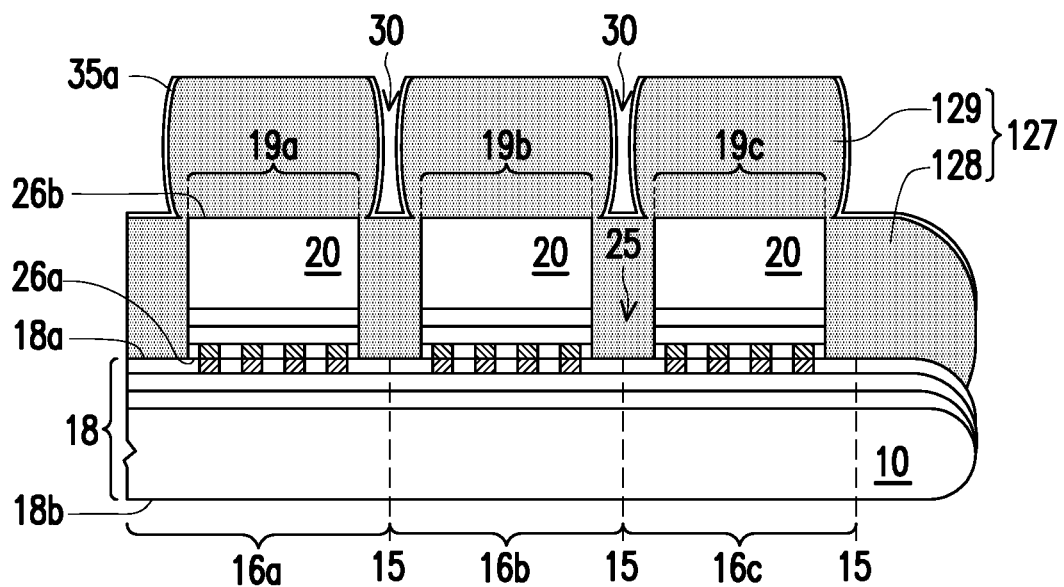

Referring to FIG. 6A and FIG. 6B, a portion of the hard mask layer 35 covering the top surface of the protrusions 129 of the dielectric material layer 127 is removed, such that the top surfaces of the protrusions 129 are exposed, and a hard mask 35a is formed. In some embodiments, the hard mask 35a is also referred as a mask layer. The removal method includes a planarization process, such as a CMP process.

Referring to FIG. 6B, the hard mask 35a covers the top surface of the body part 128 and the sidewalls of the protrusions 129 of the dielectric material layer 127. In some embodiments, the top surface of the hard mask 35a is substantially level with the top surfaces of the protrusions 129. In some embodiments, the hard mask 35a on sidewalls of the protrusions 129 is arc shaped, and a portion of the protrusion 129 is covered by the hard mask 35a.

Figure 6C:
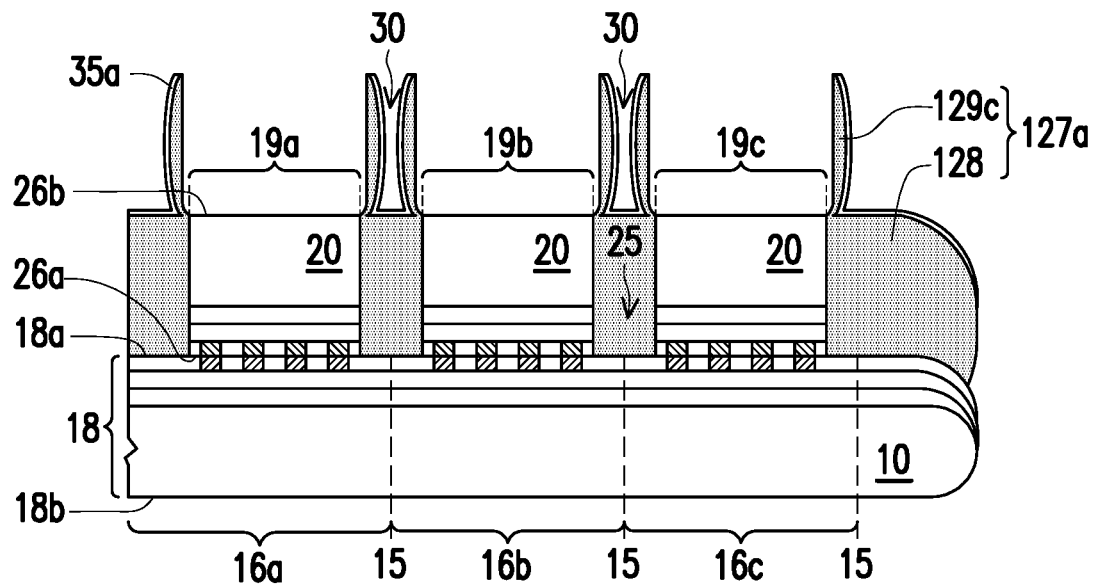

Referring to FIG. 6B and FIG. 6C, portions of the protrusions 129 are removed with the hard mask 35a as a mask, and a dielectric material layer 127a including the body part 128 and a plurality of remnants 129c is formed. In some embodiments, the second surfaces 26b of the dies 19a, 19b and 19c are exposed, but the disclosure is not limited thereto. The removal method includes an etching process, for example. The etching process may be an anisotropic etching process or an isotropic etching process. In some embodiments, the etching process includes a wet etching process, a dry etching process, or a combination thereof.

Referring to FIG. 6C, in some embodiments, the second surfaces 26b of the dies 19a, 19b and 19c are completely exposed. The remnants 129c are located on the body part 128 and surrounded and covered by the hard mask 35a. In some embodiments, the remnant 129c is arc shaped, and has a straight sidewall and an arced sidewall. The arced sidewall is in contact with and covered by the hard mask 35a, but the disclosure is not limited thereto. In some other embodiments, both sidewalls of the remnant 129c are not straight. The top surface of the body part 128 is covered by the hard mask 35a and the remnants 129c.

Figure 6D:
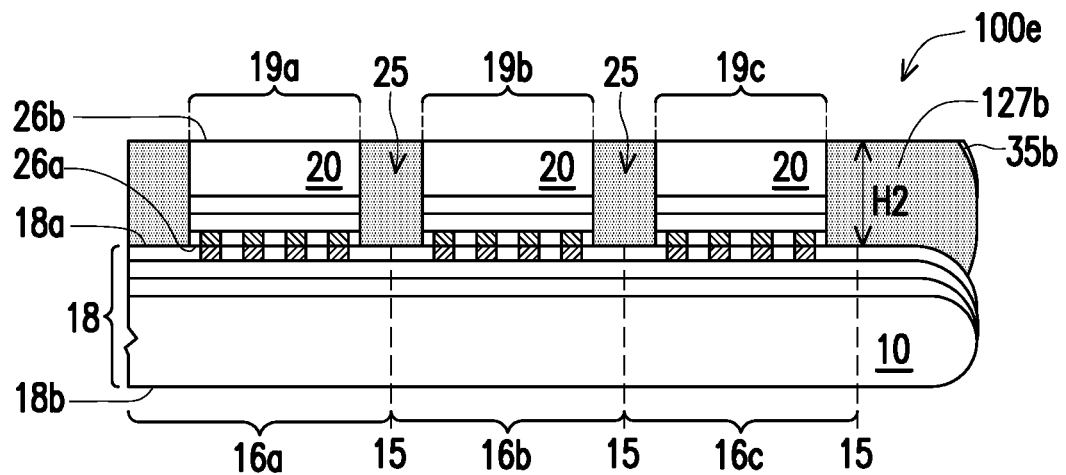

Referring to FIG. 6C and FIG. 6D, the hard mask 35a, the remnants 129c and a portion of the body part 128 of the dielectric material layer 127, and portions of the dies 19a, 19b and 19c are removed, such that a dielectric layer 127b is formed, and the top surface of the dielectric layer 127b is substantially level with the second surfaces 26b of the dies 19a, 19b and 19c. In some embodiments, a hard mask 35b is remained on the edge of the dielectric material layer 127b. The removal method includes a planarization process, such as a CMP process. A semiconductor package structure 100e is thus completed. Except for a hard mask 35b may be remained on the edge of the dielectric material layer 127b, the other structural characteristics of the semiconductor package structure 100e is similar to those of the semiconductor package structure 100c/100d.

Figure 7:
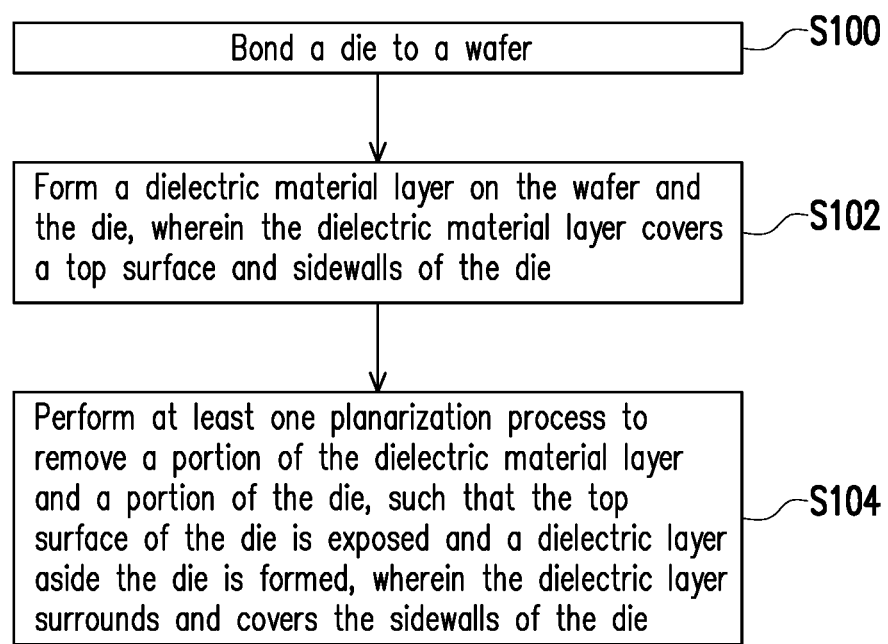
FIG. 7 is a flow chart of a method of forming a semiconductor package structure according to some embodiments of the disclosure.

FIG. 7 is a flow chart of a method of forming a semiconductor package structure according to some embodiments of the disclosure. Referring to FIG. 7, in step S100, a die is bonded to a wafer. In step S102, a dielectric material layer is formed on the wafer and the die, wherein the dielectric material layer covers a top surface and sidewalls of the die. In step S104, at least one planarization process is performed to remove a portion of the dielectric material layer and a portion of the die, such that the top surface of the die is exposed and a dielectric layer aside the die is formed, wherein the dielectric layer surrounds and covers the sidewalls of the die.

In the third to fifth embodiments of the disclosure, the body part 128 of the dielectric material layer 127 is covered and protected by the mask layer 32/132 or the hard mask 35a when removing portions of the protrusions 129, and remnants 129a/129b/129c are remained. Therefore, the damage or dishing issue of the body part 128 of the dielectric material layer 127, especially the damage of the body part 128 on the edge of the wafer 18 is avoided or reduced. In the first embodiment of the disclosure, as the protrusion 29 is a continuous layer covering the body part 28, the body part 28 is not damaged when removing the protrusion 29 or during the planarization process. Therefore, the sidewalls of the dies 19a, 19b and 19c are always covered and protected by the dielectric material layer 127a/27 during the planarization process. As a result, the damage of dies 19a, 19b and 19c is avoided or reduced, that is, the topography degradation of the edge die is avoided or reduced. In these embodiments, all of the dies 19a, 19b and 19c on the wafer 18 are effective dies. Thus, no chip area penalty loss of all effective dies is achieved.

On the other hand, in the embodiments of the disclosure, the top corners of the dies 19a, 19b and 19c are covered and protected by the dielectric material layer 27/127/127a, the top corner rounding issue that may be occurred during the removal or planarization or thinning processes is avoided or reduced.

In some embodiments of the disclosure, after the semiconductor package structure 100a/110b/110c/100d/100e is formed, subsequent processes may be performed to stack more layers of dies or devices on the semiconductor package structure 100a/110b/110c/100d/100e, so as to form a multi-layer stacked chip-on-wafer structure. Vias such as through silicon vias (TSVs), through insulator vias (TIVs), through dielectric vias (TDVs), or the like, or a combination thereof may be formed to electrical connect the dies or devices on the semiconductor package structure 100a/110b/110c/100d/100e to the dies 19a/19b/19c and the wafer 18. In some embodiments, after the multi-layer stacked chip-on-wafer structure is formed, a die saw process is performed to singulate the stacked structure.

In the embodiments of the disclosure, as the top surface of the dielectric layer around the dies are coplanar with the top surfaces of the dies. That is, the dielectric layer has the same plane with the discrete dies. Therefore, more layers of the dies or devices are allowed to be further stacked on the semiconductor package structure formed above. In some embodiments, two or more layers of dies are allowed to be stacked on the wafer.

In accordance with some embodiments of the disclosure, a method of manufacturing a semiconductor package structure includes the following steps. A die is bonded to a wafer. A dielectric material layer is formed on the wafer and the die. The dielectric material layer covers a top surface and sidewalls of the die. At least one planarization process is performed to remove a portion of the dielectric material layer and a portion of the die, such that the top surface of the die is exposed and a dielectric layer aside the die is formed. The dielectric layer surrounds and covers the sidewalls of the die.

In accordance with alternative embodiments of the disclosure, a method of manufacturing a semiconductor package structure includes the following steps. A plurality of dies are bonded to a wafer. A dielectric material layer is formed on the wafer and on the plurality of dies to cover sidewalls and top surfaces of the plurality of dies. The dielectric material layer comprises a body part aside the dies and a plurality of protrusions on the plurality of dies. A mask layer is formed to at least cover sidewalls of the plurality of protrusions and a top surface of the body part. A removal process is performed, so as to partially remove the plurality of protrusions of the dielectric material layer using the mask layer as a mask, and the plurality of protrusions remained form a plurality of remnants. The mask layer and the plurality of remnants are removed. A portion of the body part of the dielectric material layer and portions of the plurality of dies are removed, so as to form a dielectric layer with a top surface level with top surfaces of the plurality of dies.

In accordance with alternative embodiments of the disclosure, a method of manufacturing a semiconductor package structure includes the following steps. A die and a dummy die are bonded to a wafer. A dielectric material layer is formed on the wafer to covers top surfaces and sidewalls of the die and the dummy die. A portion of the dielectric material layer and a portion of the die are removed by performing at least one planarization process. The sidewalls of the die are laterally protected by the dielectric material layer and the dummy die during the at least one planarization process.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a semiconductor package structure, comprising:
    bonding a plurality of dies to a wafer;
    forming a dielectric material layer on the wafer and on the plurality of dies to cover sidewalls and top surfaces of the plurality of dies, wherein the dielectric material layer comprises a body part aside the plurality of dies and a plurality of protrusions on the plurality of dies;
    forming a mask layer at least covering sidewalls of the plurality of protrusions and a top surface of the body part;
    performing a removal process, partially removing the plurality of protrusions of the dielectric material layer using the mask layer as a mask, and the plurality of protrusions remained form a plurality of remnants;
    removing the mask layer and the plurality of remnants; and removing a portion of the body part of the dielectric material layer and portions of the plurality of dies, so as to form a dielectric layer with a top surface level with top surfaces of the plurality of dies.

2. The method of claim 1, wherein a bottom width of one of the plurality of protrusions is greater than a width of one of the plurality of dies, and the one of the plurality of protrusions covers the top surface of the one of the plurality of dies and a portion of the top surface of the body part.

3. The method of claim 2, wherein
the plurality of protrusions of the dielectric material layer have a plurality of gaps therebetween; and
the mask layer fills in the plurality of gaps.

4. The method of claim 3, wherein the mask layer further extends to cover portions of the top surfaces of the plurality of protrusions.

5. The method of claim 4, wherein the plurality of remnants cover edges of the plurality of dies and a portion of the top surface of the body part.

6. The method of claim 5, wherein the plurality of remnants, a portion of the body part of the dielectric material layer and portions of the plurality of dies are removed by a planarization process.

7. The method of claim 3, wherein the removal process removes portions of the protrusions and a portion of the mask layer by a blanket etching process, such that thicknesses of the plurality of protrusions and a thickness of the mask layer are reduced.

8. The method of claim 7, wherein after the blanket etching process is performed, the mask layer remained is stripped, and the remnants, a portion of the body part and portions of the plurality of dies are removed by a planarization process.

9. The method of claim 3, wherein the mask layer is a hard mask, conformally formed on sidewalls of the plurality of protrusions and on the top surface of the body part.

10. The method of claim 9, wherein after the removal process, the hard mask, the remnant, a portion of the body part and portions of the plurality of dies are removed by a planarization process.

11. A method of manufacturing a semiconductor package structure, comprising:
bonding a first die and a dummy die to a wafer, wherein the wafer comprises a second die embedded in the wafer, and the second die is electrically connected to the first die;
forming a dielectric material layer on the wafer to cover top surfaces and sidewalls of the first die and the dummy die; and
removing a portion of the dielectric material layer and a portion of the first die by performing at least one planarization process, wherein the sidewalls of the first die are laterally protected by the dielectric material layer and the dummy die during the at least one planarization process,
wherein the at least one planarization process comprises:
a first planarization process is performed until the top surface of the first die is exposed; and
a second planarization process is performed to reduce a thickness of the first die,
wherein after the second planarization process is performed, a portion of the top surface of the dummy die is inclined.

12. The method of claim 11, wherein the dummy die is bonded aside the first die and is closer to an edge of the wafer than the first die.

13. A method of manufacturing a semiconductor package structure, comprising:
bonding a plurality of dies to a wafer;
forming a dielectric material layer on the wafer and on the plurality of dies to cover sidewalls and top surfaces of the dies, wherein the dielectric material layer comprises a body part laterally aside the plurality of dies and a plurality of protrusions on the plurality of dies, the plurality of protrusions are spaced from each other;
selectively removing first portions of the plurality of protrusions, while protecting the body part of the dielectric material layer; and
removing second portions of the plurality of protrusions.

14. The method of claim 13, wherein the body part of the dielectric material layer is protected by the second portions of the plurality of protrusions and a mask layer, while selectively removing the first portions of the plurality of protrusions.

15. The method of claim 14, wherein the mask layer is formed after forming the dielectric material layer to cover a top surface of the body part.

16. The method of claim 14, further comprising removing the mask layer after selectively removing the first portions of the plurality of protrusions.

17. The method of claim 13, wherein the selectively removing the first portions of the plurality of protrusions comprises performing an etching process, and the removing the second portions of the plurality of protrusions comprises performing a chemical mechanical polishing process.

18. The method of claim 13, wherein top surfaces of the plurality of dies are partially exposed after selectively removing the first portions of the plurality of protrusions and before removing the second portions of the plurality of protrusions.

19. The method of claim 13, wherein at least top corners of the plurality of dies are covered by the second portions of the plurality of the protrusions after selectively removing the first portions of the plurality of protrusions.

20. The method of claim 13, further comprising removing portions of the body part of the dielectric material layer and portions of the plurality of dies after removing the second portions of the plurality of protrusions.

* * * * *